United States Patent
Young et al.

(10) Patent No.: US 11,579,827 B1
(45) Date of Patent: Feb. 14, 2023

(54) SELF-CONFIGURING INSPECTION SYSTEMS FOR PRINTERS

(71) Applicants: Nathan Young, Boulder, CO (US); Scott R. Johnson, Erie, CO (US)

(72) Inventors: Nathan Young, Boulder, CO (US); Scott R. Johnson, Erie, CO (US)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 17/488,282

(22) Filed: Sep. 28, 2021

(51) Int. Cl.
*G06F 3/12* (2006.01)
*G03F 1/84* (2012.01)
*B41J 2/045* (2006.01)

(52) U.S. Cl.
CPC ........ *G06F 3/1254* (2013.01); *B41J 2/04508* (2013.01); *G03F 1/84* (2013.01); *G06F 3/1204* (2013.01)

(58) Field of Classification Search
None
See application file for complete search history.

(56) References Cited

U.S. PATENT DOCUMENTS

| | | | |
|---|---|---|---|
| 6,577,907 | B1 | 6/2003 | Czyszczewski et al. |
| 8,799,243 | B1* | 8/2014 | Havlik ................. G06Q 10/105 |
| | | | 707/694 |
| 9,148,525 | B2 | 9/2015 | Matsuoka |
| 9,641,700 | B2 | 5/2017 | Schumann et al. |
| 9,762,750 | B2 | 9/2017 | Huber et al. |
| 2011/0149331 | A1 | 6/2011 | Duggan et al. |
| 2014/0104662 | A1* | 4/2014 | Sung .................... H04N 1/0476 |
| | | | 358/498 |
| 2017/0041486 | A1 | 2/2017 | Noda et al. |
| 2021/0385339 | A1* | 12/2021 | Iida ....................... H04N 1/0044 |

FOREIGN PATENT DOCUMENTS

JP 6007690 B2 10/2016

* cited by examiner

*Primary Examiner* — Frantz Bataille
(74) *Attorney, Agent, or Firm* — Duft & Bornsen, PC

(57) ABSTRACT

Systems and methods are provided for print review systems. One embodiment is a print review system that includes a memory that stores inspection parameters of print media marked by a printer, an interface that communicates with the printer, and a controller that, in response to the printer initiating processing of a print job, receives an indication via the interface of settings used by the printer in processing the print job, modifies the parameters based on the settings, inspects the print media based on the modified parameters, and reports compliance of the print job with the modified parameters.

20 Claims, 16 Drawing Sheets

FIG. 8

FLUSH LINE JETOUT PARAMETERS: ALLOWED MAXIMUM JETOUT OPTICAL DENSITY THRESHOLD FROM NORMAL

Ink Type 1
Paper Type 1

| Resolution | All Qualities |
|---|---|
| 1200x1200 – 50 | 12.5% |
| 1200x600 – 75 | 12.5% |
| 1200x600 – 100 | 12.5% |
| 600x600 – 120 | 12.5% |
| 600x600 – 150 | 12.5% |

Paper Type 2

| Resolution | All Qualities |
|---|---|
| 1200x1200 – 50 | 10% |
| 1200x600 – 75 | 10% |
| 1200x600 – 100 | 10% |
| 600x600 – 120 | 12.5% |
| 600x600 – 150 | 12.5% |

Paper Type 3

| Resolution | All Qualities |
|---|---|
| 1200x1200 – 50 | 15% |
| 1200x600 – 75 | 15% |
| 1200x600 – 100 | 15% |
| 600x600 – 120 | 15% |
| 600x600 – 150 | 15% |

Ink Type 2
Paper Type 1

| Resolution | All Qualities |
|---|---|
| 1200x1200 – 50 | 12.5% |
| 1200x600 – 75 | 12.5% |
| 1200x600 – 100 | 12.5% |
| 600x600 – 120 | 12.5% |
| 600x600 – 150 | 12.5% |

Paper Type 2

| Resolution | All Qualities |
|---|---|
| 1200x1200 – 50 | 10% |
| 1200x600 – 75 | 17.5% |
| 1200x600 – 100 | 17.5% |
| 600x600 – 120 | 17.5% |
| 600x600 – 150 | 17.5% |

Paper Type 3

| Resolution | All Qualities |
|---|---|
| 1200x1200 – 50 | 12.5% |
| 1200x600 – 75 | 12.5% |
| 1200x600 – 100 | 12.5% |
| 600x600 – 120 | 12.5% |
| 600x600 – 150 | 12.5% |

800

FIG. 9
FLUSH LINE JETOUT PARAMETERS:
MAXIMUM NUMBER OF ALLOWED PAGES WITH JETOUTS

Low Ink Deposition Flushing

| Resolution | Low Setting | Medium Setting | High Setting |
|---|---|---|---|
| Coated Line 4 | 32 pages | 32 pages | 32 pages |
| Coated Line 8 | 16 pages | 16 pages | 16 pages |
| Coated Line 16 | 8 pages | 8 pages | 8 pages |
| Coated Line 32 | 4 pages | 4 pages | 4 pages |

High Ink Deposition Flushing

| Resolution | Low Setting | Medium Setting | High Setting |
|---|---|---|---|
| Plain Line 1 | Unsupported | Unsupported | Unsupported |
| Plain Line 2 | Unsupported | Unsupported | Unsupported |
| Plain Line 4 | Unsupported | Unsupported | Unsupported |
| Plain Line 8 | 16 pages | 16 pages | 16 pages |
| Plain Line 16 | 8 pages | 8 pages | 8 pages |

FIG. 10

FLUSH LINE JETOUT PARAMETERS:
ALLOWED JETOUTS PER PRINTHEAD

Low Ink Deposition Flushing (Heads are handled separately)

| Resolution | Low | Medium | High |
|---|---|---|---|
| 1200x1200 – 50 | 4 jet-outs | 2 jet-outs | 1 jet-out |
| 1200x600 – 75 | 4 jet-outs | 2 jet-outs | 1 jet-out |
| 1200x600 – 100 | 4 jet-outs | 2 jet-outs | 1 jet-out |
| 600x600 – 120 | 4 jet-outs | 2 jet-outs | 1 jet-out |
| 600x600 – 150 | 4 jet-outs | 2 jet-outs | 1 jet-out |

High Ink Deposition Flushing (Heads are handled together)

| Resolution | Low | Medium | High |
|---|---|---|---|
| 1200x1200 – 50 | 8 jet-outs | 4 jet-outs | 2 jet-out |
| 1200x600 – 75 | 8 jet-outs | 4 jet-outs | 2 jet-out |
| 1200x600 – 100 | 8 jet-outs | 4 jet-outs | 2 jet-out |
| 600x600 – 120 | 8 jet-outs | 4 jet-outs | 2 jet-out |
| 600x600 – 150 | 8 jet-outs | 4 jet-outs | 2 jet-out |

1000

FIG. 11
FLUSHING PAGE JETOUT PARAMETERS:
ALLOWED MAXIMUM JETOUT OPTICAL DENSITY
THRESHOLD FROM NORMAL

Ink Type 1
Paper Type 1

| Resolution | All Qualities |
|---|---|
| 1200x1200 – 50 | 15% |
| 1200x600 – 75 | 15% |
| 1200x600 – 100 | 20% |
| 600x600 – 120 | 17.5% |
| 600x600 – 150 | 20% |

Paper Type 2

| Resolution | All Qualities |
|---|---|
| 1200x1200 – 50 | 12.5% |
| 1200x600 – 75 | 15% |
| 1200x600 – 100 | 10% |
| 600x600 – 120 | 17.5% |
| 600x600 – 150 | 20% |

Paper Type 3

| Resolution | All Qualities |
|---|---|
| 1200x1200 – 50 | 15% |
| 1200x600 – 75 | 15% |
| 1200x600 – 100 | 15% |
| 600x600 – 120 | 15% |
| 600x600 – 150 | 15% |

1100

Ink Type 2
Paper Type 1

| Resolution | All Qualities |
|---|---|
| 1200x1200 – 50 | 20% |
| 1200x600 – 75 | 20% |
| 1200x600 – 100 | 20% |
| 600x600 – 120 | 15% |
| 600x600 – 150 | 15% |

Paper Type 2

| Resolution | All Qualities |
|---|---|
| 1200x1200 – 50 | 25% |
| 1200x600 – 75 | 20% |
| 1200x600 – 100 | 20% |
| 600x600 – 120 | 20% |
| 600x600 – 150 | 20% |

Paper Type 3

| Resolution | All Qualities |
|---|---|
| 1200x1200 – 50 | 15% |
| 1200x600 – 75 | 15% |
| 1200x600 – 100 | 15% |
| 600x600 – 120 | 15% |
| 600x600 – 150 | 15% |

FIG. 12

FLUSHING PAGE JETOUT PARAMETERS:
ALLOWED JETOUTS PER PRINTHEAD

| Resolution | Low | Medium | High |
|---|---|---|---|
| 1200x1200 – 50 | 4 jet-outs | 2 jet-outs | 1 jet-out |
| 1200x600 – 75 | 4 jet-outs | 2 jet-outs | 1 jet-out |
| 1200x600 – 100 | 4 jet-outs | 2 jet-outs | 1 jet-out |
| 600x600 – 120 | 4 jet-outs | 2 jet-outs | 1 jet-out |
| 600x600 – 150 | 4 jet-outs | 2 jet-outs | 1 jet-out |

COLOR ALIGNMENT PARAMETERS: ALLOWABLE DISTANCE

Paper Type 1

| Resolution | Low Setting | Medium Setting | High Setting |
|---|---|---|---|
| 1200x1200 – 50 | +/- 300 microns | +/- 200 microns | +/- 100 microns |
| 1200x600 – 75 | +/- 300 microns | +/- 200 microns | +/- 100 microns |
| 1200x600 – 100 | +/- 300 microns | +/- 200 microns | +/- 100 microns |
| 600x600 – 120 | +/- 375 microns | +/- 250 microns | +/- 125 microns |
| 600x600 – 150 | +/- 375 microns | +/- 250 microns | +/- 125 microns |

Paper Type 2

| Resolution | Low Setting | Medium Setting | High Setting |
|---|---|---|---|
| 1200x1200 – 50 | +/- 300 microns | +/- 200 microns | +/- 100 microns |
| 1200x600 – 75 | +/- 300 microns | +/- 200 microns | +/- 100 microns |
| 1200x600 – 100 | +/- 300 microns | +/- 200 microns | +/- 100 microns |
| 600x600 – 120 | +/- 375 microns | +/- 250 microns | +/- 125 microns |
| 600x600 – 150 | +/- 375 microns | +/- 250 microns | +/- 125 microns |

Paper Type 3

| Resolution | Low Setting | Medium Setting | High Setting |
|---|---|---|---|
| 1200x1200 – 50 | +/- 375 microns | +/- 250 microns | +/- 125 microns |
| 1200x600 – 75 | +/- 375 microns | +/- 250 microns | +/- 125 microns |
| 1200x600 – 100 | +/- 375 microns | +/- 250 microns | +/- 125 microns |
| 600x600 – 120 | +/- 450 microns | +/- 300 microns | +/- 150 microns |
| 600x600 – 150 | +/- 450 microns | +/- 300 microns | +/- 150 microns |

HEAD ALIGNMENT PARAMETERS: ALLOWABLE DISTANCE

Paper Type 1

| Resolution | Low Setting | Medium Setting | High Setting |
|---|---|---|---|
| 1200x1200 – 50 | +/- 120 microns | +/- 80 microns | +/- 40 microns |
| 1200x600 – 75 | +/- 120 microns | +/- 80 microns | +/- 40 microns |
| 1200x600 – 100 | +/- 120 microns | +/- 80 microns | +/- 40 microns |
| 600x600 – 120 | +/- 150 microns | +/- 100 microns | +/- 50 microns |
| 600x600 – 150 | +/- 150 microns | +/- 100 microns | +/- 50 microns |

Paper Type 2

| Resolution | Low Setting | Medium Setting | High Setting |
|---|---|---|---|
| 1200x1200 – 50 | +/- 120 microns | +/- 80 microns | +/- 40 microns |
| 1200x600 – 75 | +/- 120 microns | +/- 80 microns | +/- 40 microns |
| 1200x600 – 100 | +/- 120 microns | +/- 80 microns | +/- 40 microns |
| 600x600 – 120 | +/- 150 microns | +/- 100 microns | +/- 50 microns |
| 600x600 – 150 | +/- 150 microns | +/- 100 microns | +/- 50 microns |

Paper Type 3

| Resolution | Low Setting | Medium Setting | High Setting |
|---|---|---|---|
| 1200x1200 – 50 | +/- 150 microns | +/- 100 microns | +/- 50 microns |
| 1200x600 – 75 | +/- 150 microns | +/- 100 microns | +/- 50 microns |
| 1200x600 – 100 | +/- 150 microns | +/- 100 microns | +/- 50 microns |
| 600x600 – 120 | +/- 180 microns | +/- 120 microns | +/- 60 microns |
| 600x600 – 150 | +/- 180 microns | +/- 120 microns | +/- 60 microns |

UNIFORMITY PARAMETERS:
ALLOWED DENSITY VARIATION ACROSS WIDTH OF PAGE

1500

Paper Type 1

| Resolution      | Low Setting | Medium Setting | High Setting |
|-----------------|-------------|----------------|--------------|
| 1200x1200 – 50  | 3.5%        | 2.0%           | 1.0%         |
| 1200x600 – 75   | 4.0%        | 2.5%           | 1.2%         |
| 1200x600 – 100  | 4.5%        | 3.0%           | 1.5%         |
| 600x600 – 120   | 4.5%        | 3.0%           | 1.5%         |
| 600x600 – 150   | 4.5%        | 3.0%           | 1.5%         |

Paper Type 2

| Resolution      | Low Setting | Medium Setting | High Setting |
|-----------------|-------------|----------------|--------------|
| 1200x1200 – 50  | 3.5%        | 3.0%           | 1.5%         |
| 1200x600 – 75   | 3.5%        | 3.0%           | 1.5%         |
| 1200x600 – 100  | 3.5%        | 3.0%           | 1.5%         |
| 600x600 – 120   | 3.5%        | 3.0%           | 1.5%         |
| 600x600 – 150   | 3.5%        | 3.0%           | 1.5%         |

Paper Type 3

| Resolution      | Low Setting | Medium Setting | High Setting |
|-----------------|-------------|----------------|--------------|
| 1200x1200 – 50  | 4.5%        | 2.0%           | 1.5%         |
| 1200x600 – 75   | 4.5%        | 2.0%           | 1.5%         |
| 1200x600 – 100  | 4.5%        | 2.0%           | 1.5%         |
| 600x600 – 120   | 4.5%        | 2.0%           | 1.5%         |
| 600x600 – 150   | 4.5%        | 2.0%           | 1.5%         |

US 11,579,827 B1

SELF-CONFIGURING INSPECTION SYSTEMS FOR PRINTERS

TECHNICAL FIELD

The following disclosure relates to the field of printing, and in particular, to inspection of printed matter.

BACKGROUND

Entities with substantial printing demands typically use a production printer. A production printer is a high-speed printer used for volume printing, such as a continuous-forms printer that prints on a web of print media stored on a large roll. A production printer typically includes a localized print controller that manages the overall operation of the printer, and a marking engine (sometimes referred to as an "imaging engine" or a "print engine"). The marking engine includes one or more arrays of printheads.

Upon receiving a print job, the print controller rasterizes logical pages of the job (e.g., to create bitmaps representing each page of the job), and the marking engine operates individual printheads to mark the web based on the rasterized logical pages. Thus, the printer marks physical pages based on the digital information of the print job.

In order to ensure that a print job has been printed at a desired level of quality, it is not uncommon for the output of a print job to be scanned. However, for print jobs that comprise thousands of pages, it is not feasible for a technician to manually review scans of those pages. Furthermore, different types of print jobs may require different types of inspection, resulting in a need for the technician to constantly make adjustments to a scanning system.

Thus, those who operate print shops continue to seek out enhanced systems and methods that permit the review of print jobs to be accomplished in an efficient and accurate manner.

SUMMARY

Embodiments described herein provide for print review systems that are capable of dynamically adjusting inspection parameters based on the current settings used by a printer to process a print job. This advantageously provides a technical benefit by ensuring that the print review system reconfigures itself based on the properties of the job that is currently being processed. Furthermore, by performing parameter adjustments in a just-in-time manner (e.g., each time the printer initiates printing), the print review system is capable of dynamically accommodating changes in scheduled printing activities.

One embodiment is a print review system that includes a memory that stores inspection parameters of print media marked by a printer, an interface that communicates with the printer, and a controller that, in response to the printer initiating processing of a print job, receives an indication via the interface of settings used by the printer in processing the print job, modifies the parameters based on the settings, inspects the print media based on the modified parameters, and reports compliance of the print job with the modified parameters.

A further embodiment is a method that includes storing, at a print review system, inspection parameters of print media marked by a printer, exchanging communications with a printer via an interface of the print review system, determining that the printer has initiated processing of a print job based on the communications, receiving an indication of settings currently used by the printer for the print job, modifying the inspection parameters based on the settings, inspecting the print media based on the modified parameters, and reporting compliance of the print job with the modified parameters.

A further embodiment is a non-transitory computer readable medium embodying programmed instructions which, when executed by a processor, are operable for performing a method. The method includes storing, at a print review system, inspection parameters of print media marked by a printer, exchanging communications with a printer via an interface of the print review system, determining that the printer has initiated processing of a print job based on the communications, receiving an indication of settings currently used by the printer for the print job, modifying the inspection parameters based on the settings, inspecting the print media based on the modified parameters, and reporting compliance of the print job with the modified parameters.

Other illustrative embodiments (e.g., methods and computer-readable media relating to the foregoing embodiments) may be described below.

DESCRIPTION OF THE DRAWINGS

Some embodiments of the present invention are now described, by way of example only, and with reference to the accompanying drawings. The same reference number represents the same element or the same type of element on all drawings.

FIGS. 8-15 are tables depicting variations in thresholds and other inspection parameters based on printer settings in illustrative embodiments.

DETAILED DESCRIPTION

The figures and the following description illustrate specific illustrative embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention, and are to be construed as being without limitation to such specifically recited examples and conditions. As a result, the invention is not limited to the specific embodiments or examples described below, but by the claims and their equivalents.

Figure 1:
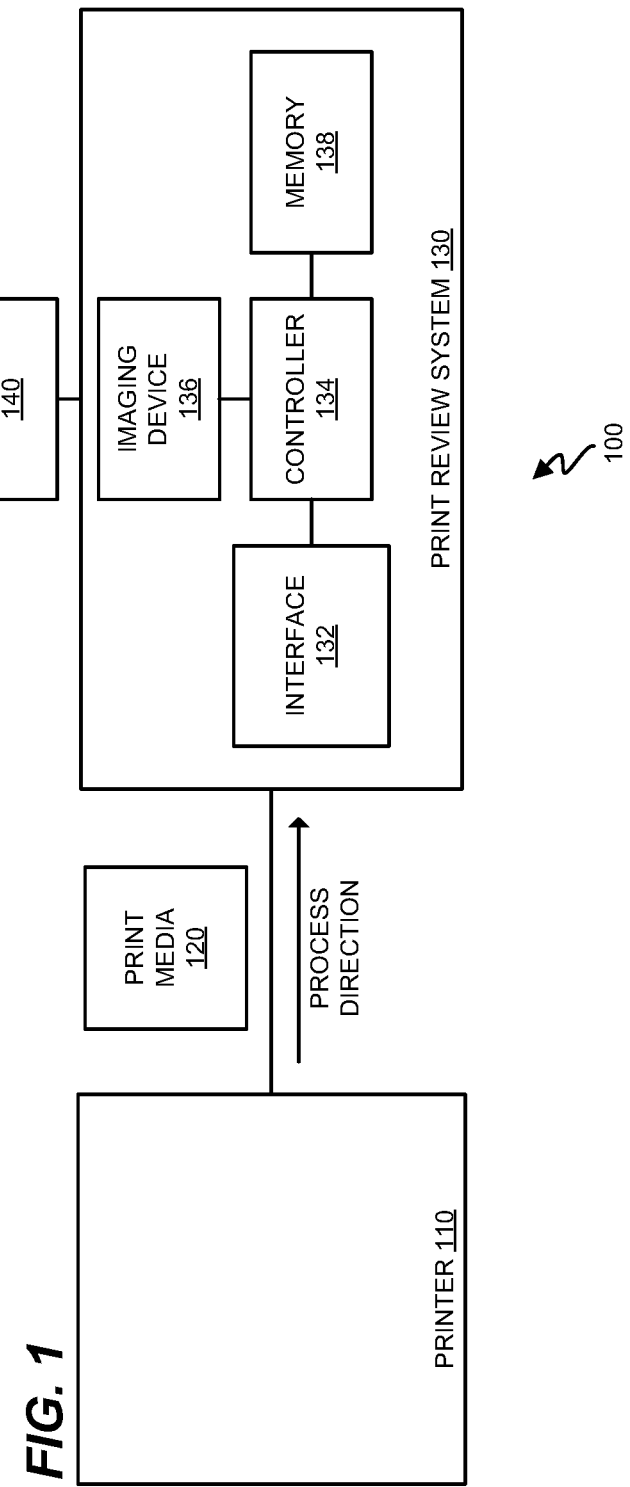
FIG. 1 is a block diagram of a print review architecture in an illustrative embodiment.

FIG. 1 is a block diagram of a print review architecture 100 in an illustrative embodiment. Print review architecture 100 comprises any system, device, or component operable to print and analyze images of print media 120 that has been marked in accordance with print data in a print job. Specifically, print review architecture 100 comprises a printer 110 for marking the print media 120, as well as a print review system 130 that dynamically adjusts its inspection parameters of print media 120 for a print job, based on settings of the printer 110 that are determined while the printer 110 is processing the print job.

Printer 110 comprises any system, device, or component operable to mark print media (e.g., paper, card stock, paper board, corrugated fiberboard, film, plastic, synthetic, textile, glass, composite or any other tangible medium suitable for printing) in accordance with received instructions in print data for a print job. In this embodiment, printer 110 comprises a continuous-forms printer that marks a web of print media 120 which travels through the printer 110 in a web direction (also referred to as a "process direction"). For example, printer 110 may include a print controller that directs the operations of one or more marking engines, which each comprise one or more arrays of printheads. The printheads may operate nozzles to eject ink or other marking materials onto the print media in accordance with instructions from the print controller as the print media advances. In further embodiments, printer 110 comprises a cut-sheet printer that marks sheets or strips of print media.

Print review system 130 comprises any device capable of imaging and/or reviewing the printed output of printer 110. In this embodiment, print review system 130 is disposed downstream from the printer 110 with respect to a web direction along which the web of print media 120 proceeds. However, in further embodiments, print review system 130 is integrated with the printer 110. Print review system 130 acquires images of the print media 120 via imaging device 136. Imaging device 136 comprises any suitable device for capturing optical data (e.g., optical scanner, camera, densitometer, etc.), such as images of the print media 120 after printing. Imaging device 136 may periodically or continuously acquire images of the print media 120 via a single camera or an array of cameras. In embodiments where an array of cameras is used, the imaging device 136 may stitch images from cameras in the array together, in order to generate a composite image that extends across a width of the print media (i.e., a direction perpendicular to a process direction of the web of print media).

In one embodiment, imaging device 136 acquires images of the print media 120 periodically and/or continuously in real-time as the printer 110 continues marking upon the print media 120 and the print media 120 advances. In one embodiment, imaging device 136 selectively determines when to acquire images. For example, an image may be acquired each time an instance of a test pattern, periodically printed by the printer 110 onto the print media 120 (e.g., every page, every ten pages, every one hundred pages, etc.), passes across the view of the imaging device 136. In one embodiment, the printer 110 is capable of printing at a higher number of Dots Per Inch (DPI) than the imaging device 136 (e.g., twelve hundred DPI as printed, as compared to six hundred DPI as scanned). In such an embodiment, a test pattern may be split and printed into physically distinct sections, wherein each section utilizes a different combination of nozzles to print at the DPI rate supported by the scanner, enabling accurate review and analysis. In a further embodiment, the resolution of images acquired by the imaging device 136 is chosen such that each pixel in the image corresponds with a size equal to or less than that of a droplet of ink applied by a nozzle at a printhead.

The images acquired by the imaging device 136 are stored in memory 138, and are analyzed by a controller 134. Controller 134 comprises any system, component, or device that characterizes images of print media 120 that has been marked by a printer 110. To perform this operation, controller 134 may compare the images to corresponding target data (e.g., as stored in memory 138) that represents an ideal image of print media that has been marked exactly in accordance with the instructions for a corresponding print job. Controller 134 may be implemented as custom circuitry, as a hardware processor executing programmed instructions, etc.

Print review system 130 has been enhanced to dynamically perform just-in-time determination of settings used by the printer 110 (e.g., while the printer 110 is marking print media 120 in accordance with data from a print job). As used herein, settings of a printer comprise alterable conditions of printing, such as print resolution, paper type or associated dot gain, ink type, job resolution, linear print speed, dryer temperature, half-tone settings, flush line settings, simplex/duplex/N-up printing modes, a number of color planes utilized, and others. As dot gain may not be explicitly listed for many paper types, the controller 134 (or a print controller of the printer 110) may include a table with empirically determined dot gains for different paper types. In further embodiments, a print controller of a printer 110 maps dot gains to a range of halftone designs to be used by the printer. The print controller of the printer 110 then selects a halftone design based on the dot gain selection, print resolution, and the printer speed.

It may be of particular relevance for the print review system 130 to review flush lines or flushing pages marked by the printer 110. Printer 110 performs flushing by instructing its printheads to eject ink periodically. This operation prevents individual nozzles of the printhead from clogging due to ink drying out near the nozzles. Flush lines, which are produced via a technique known as line flushing, are created by instructing the nozzles of a printhead to eject ink as printed lines across the width of the printed page. For example, this may be performed at the top or bottom of one or more printed pages (e.g., each printed page, every N printed pages, etc.) for a print job. Flush pages (also known as "flushing pages" or "quality check pages"), comprise additional pages that are periodically inserted into the print steam during printing. Flush pages may be used for flushing (e.g., line flushing) and/or to receive other quality check markings. The manner in which the nozzles for a printhead eject ink for a flush line may differ from that used for flush pages. As a result, different inspection parameters may be needed for flush lines than for flush pages.

The settings of the printer 110 may be reviewed to determine, for example, a type of ink utilized for the print job, a dot gain (e.g., the amount that an ejected ink drop spreads across the print media used), and other relevant pieces of information. The print review system 130 dynamically adjusts its own inspection parameters based on the settings for each print job being printed. As used herein, an inspection parameter comprises an adjustable variable at the print review system 130 relating to acquisition of images of the print media 120, review of images of the print media 120, thresholds for determining non-compliance of the images with expected standards, and/or thresholds for detecting printhead conditions at the printer 110 based on review of the images. Printhead conditions comprise any physical, electrical, or firmware status relating to a printhead, or portion thereof, which has an impact on the ability of the printhead to eject ink onto print media in accordance with supplied instructions. Examples of printhead conditions include "jetout," "fully operational," "defective," and others.

An example of inspection parameters and their relation to printhead conditions is provided with respect to jetouts. A jetout may appear differently (e.g., smaller) on a print media with a high dot gain than on a print media with a low dot gain. By dynamically adjusting parameters for detection of a jetout based on dot gain, the print review system 130 achieves a technical benefit wherein detection of printhead conditions is performed with greater accuracy and versatility in a manner that accounts for differences in dot gain.

Printhead condition data may include location information as well as descriptive information. Printhead conditions may be associated with a region on the page (and vice versa) by mapping locations (e.g., locations along a web or pixel locations in an image of the web) indicated in printhead condition data to the regions. Printhead condition data may also be associated with printheads or nozzles (or vice versa) by mapping. The mapping may be based on corresponding printhead location information, an image of the printed test pattern, test pattern print instructions, and/or printer 110 configuration information (e.g., the physical/electrical arrangement and interconnections of device within the printer 110 such as printheads, nozzles, print controller, color planes and/or etc.).

During operation, a controller 134 of the print review system 130 communicates with the printer 110 via an interface 132 to determine "live" (e.g., real-time) settings of the printer 110 during printing of a print job. The controller 134 then modifies inspection parameters of the print job, based on the settings of the printer, before the portions of the print media 120 that have been marked by the printer 110 reach the imaging device 136. The imaging device 136 then generates, in accordance with the updated inspection parameters, images of print media 120 that have been marked by a printer 110, and controller 134 stores those images in memory 138. Controller 134 then reviews images generated by the imaging device 136 for the print job, and operates a display 140 that presents the results of print job inspection to a user for review via a GUI.

Based on a comparison of the images of the print media 120 to the target data, controller 134 is capable of detecting and/or reporting printhead conditions relating to the current print job. For example, controller 134 may detect the presence of defects or other conditions at a printhead of the printer 110, such as jetouts (i.e., the condition of failing to apply ink to the print media), in accordance with the techniques described in U.S. patent application Ser. No. 16/712,985 filed on Dec. 12, 2019, entitled "ENHANCED PRINT DEFECT DETECTION," and herein incorporated by reference. In one embodiment, controller 134 additionally receives notifications from a controller of the printer 110, such as notifications that firmware updates are available. The controller 134 may categorize the printhead conditions that have been detected. For example, controller 134 may assign notifications to types/categories comprising informational notifications, warning notifications, and error notifications.

Controller 134 generates a GUI that notifies a print shop operator of printhead conditions, and directs display 140 to present the GUI to a user. Display 140 comprises any suitable device for visually displaying digital information, and may comprise a monitor, projector, touchscreen, etc. Though shown as incorporated in print review system 130, imaging device 136 and controller 134 may be implemented as separate devices. Any suitable components may be implemented separately but communicatively coupled (e.g., as physically distinct components or devices), or may alternatively be integrated into print review system 130, in various embodiments.

The particular arrangement, number, and configuration of components described herein is illustrative and non-limiting. Illustrative details of the operation of print review architecture 100 will be discussed with regard to FIG. 2. Assume, for this embodiment, that a printer 110 has multiple print jobs in a queue awaiting printing.

Figure 2:
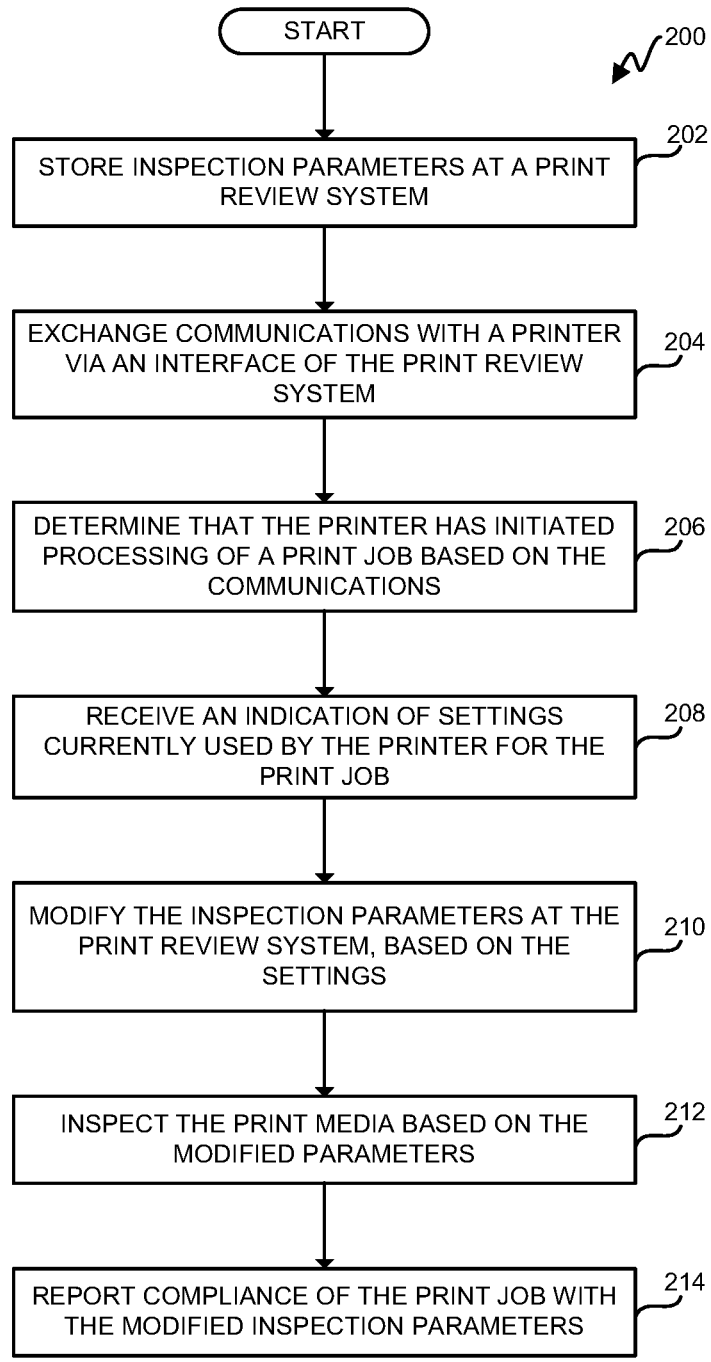
FIG. 2 is a flowchart illustrating a method for operating a print review system to dynamically adjust inspection parameters in an illustrative embodiment.

FIG. 2 is a flowchart illustrating a method 200 for operating a print review system to dynamically adjust inspection parameters in an illustrative embodiment. The steps of method 200 are described with reference to print review system 130 of FIG. 1, but those skilled in the art will appreciate that method 200 may be performed in other systems. The steps of the flowcharts described herein are not all inclusive and may include other steps not shown. The steps described herein may also be performed in an alternative order.

In step 202, controller 134 stores inspection parameters in memory 138 at the print review system 130. Examples of inspection parameters include parameters for image resolution; parameters for detection of flush line or flush page jetouts, such as: a maximum jet out optical density threshold allowed (also referred to as a "contrast dip"), a maximum number of allowed pages with jetouts, a minimum jetout width required to detect the presence of a jetout, a maximum number of allowed jetouts per printhead; an allowable distance for color alignment; an allowable distance for head alignment; an allowed density variation across a width of a page; and others. As used herein, an optical density may refer to an actual optical density (e.g., as measured by a spectrophotometer), or a simulated optical density estimated by controller 134 based on input from a color scanner or other imaging device.

In one embodiment, each inspection parameter is determined by reference to one or more tables stored in memory 138. Each table provides for variations of the inspection parameter based on variations of detected printer settings. The variations may, for example, be empirically determined based on prior testing. In this manner, when printer settings are altered, the controller 134 may consult a table in the memory 138 based on the printer settings in order to determine the appropriate value for each inspection parameter.

In step 204, controller 134 exchanges communications with the printer 110 via interface 132 of the print review system 130. These communications may comprise Job Messaging Format (JMF) messages sent between interface 132 and the printer 110 (e.g., via a wired Ethernet connection in accordance with Transmission Control Protocol and Internet Protocol (TCP/IP) standards, wireless connection, or other connection). In one embodiment, the print review system 130 subscribes to status messaging from the printer 110 via JMF. The printer 110 then transmits JMF messaging to the print review system 130 as the status of the printer 110 changes (e.g., from idle to printing).

The printer 110 proceeds to initiate processing of a print job in the queue. Initiating processing of the print job may refer to rasterizing print data for the print job, transmitting rasterized print data for a print job to a marking engine of the printer 110, physically marking the print media 120 based on print data for the print job, initiating movement of the print media 120, or performing other actions at the printer 110 that cause the print job to be printed. In one embodiment, the print job includes print data (e.g., Portable Document Format (PDF) data accompanied by a Job Definition Format (JDF) job ticket) forming instructions for marking the print media 120. This print data may include test patterns (e.g., a series of stripes or other patterns for marking by printheads of the printer). As the print media 120 advances from the printer 110, it passes downstream towards the imaging device 136, captures images of the marked print media for the print job. In one embodiment, upon initiating processing of a print job, the printer 110 transmits a JMF message to the print review system 130 indicating the change in status from idle to printing, or from printing a first job to printing a second job.

In step 206, the controller 134 determines that the printer 110 has initiated processing of a next print job (e.g., by marking print media 120 in accordance with print data for the print job) based on the communications. In one embodiment, this comprises reviewing a JMF message sent by the printer 110 to the interface 132, stating that the printer 110 has initiated processing of the print job.

In step 208, controller 134 receives an indication of settings currently used by the printer 110 for the print job. In one embodiment, the controller 134 operates the interface 132 to transmit a JMF query for current settings of the printer 110 while it processes the print job (e.g., by requesting a set of specific printer settings, or requesting all printer settings. The printer 110 then responds with a JMF response indicating the settings of the printer 110 for the print job being processed. In a further embodiment, the printer 110 automatically provides this information as a JMF message that accompanies or is integrated into a message from the printer 110 which indicates that processing of the print job has initiated.

In step 210, the controller 134 modifies the inspection parameters at the print review system 130 based on the settings. In one embodiment, this comprises consulting one or more tables that indicate different values for the inspection parameters based on variations in printer settings. In a further embodiment, this comprises controller 134 associating each potential variation in a printer setting with a numerical value, and dynamically determining an inspection parameter as a weighted combination of numerical values. For example, the controller 134 may calculate a dynamic value for an inspection parameter according to a formula $ax+by+c$, wherein "a, b, and c" are predefined weights, while "x" and "y" are variations in relevant printer settings.

In step 212, the controller 134 inspects the print media based on the modified inspection parameters. In one embodiment, the changes in inspection parameters alter the manner in which inspection is performed. For example, changes in the inspection parameters may alter the portion of images of the print media 120 that are inspected, may alter detection thresholds for various printhead conditions, etc. Further details of various detection thresholds will be discussed with regard to FIGS. 11-20 below.

In step 214, the controller 134 reports compliance (or non-compliance) of the print job with the modified parameters. As used herein, compliance may refer to a lack of detection of any abnormal printhead conditions (e.g., jetouts, etc.), while non-compliance may refer to the inspection process detecting one or more abnormal printhead conditions. Reporting compliance may take many forms. In one embodiment, this comprises controller 134 updating a GUI presented to a print shop operator via display 140, in order to report detected printhead conditions. In further embodiments, this comprises controller 134 generating and transmitting a text message or email message to an account of a print shop operator, or performing other actions. In still further embodiments, the controller 134 issues a stop printing command to the printer 110. This limits the number of non-compliant sheets that are printed, saving both print media and ink at the printer 110.

Method 200 provides a technical benefit over prior systems and techniques, because it enables a print review system 130 to dynamically adjust its inspection processes based on the type of printing being performed by a printer, on a job-by-job basis. This provides a notable advantage by eliminating the need for a print shop operator to continuously revise inspection procedures each time a new print job is loaded. A further technical benefit is that if a queue for a printer is altered to change the number and/or type of jobs in the queue, the print review system 130 is capable of dynamically accounting for the changed properties of jobs in the queue. That is, because modifications to inspection parameters are performed just-in-time (e.g., as soon as the printer 110 initiates processing or marking of the job), the inspection process is immune to problems related to alteration of the printing queue.

In further embodiments, the controller 134 may adjust specific inspection parameters based on specific weighted formulas. In one example, a permitted threshold for alignment is determined according to a weighted combination of operator input, dot gain, and print resolution. Specifically, the formula may be $(ax+b)(c+d)$, wherein "a" is a predefined value, "x" is a numerical value based on a print shop operator's input, "b" is a predefined value, "c" is a numerical value based on a dot gain setting, and "d" is a numerical value based on print resolution.

In a further example, a permitted threshold for ink density is determined based on a weighted combination of dot gain and operator input according to the formula $(ax)(by)$, wherein "a" and "b" are predefined values, "x" is a numerical value based on a print shop operator's input, and "y" is a numerical value based on print resolution. In a further example, a jetout tolerance is determined based on a weighted combination of dot gain and flush line height. In a further example, a contrast threshold is determined based on a weighted combination of dot gain, ink type, print resolution, and linear printing speed.

In a further example, an analysis region of the image being inspected is scaled as a weighted combination of values defined by dot gain (determined by paper type), dryer settings (e.g., temperature), linear print speed, and print resolution. This helps to accommodate for differences in paper shrinkage found across various types of print media. By storing or calculating scaling factors for specific types of paper, speed, and/or dryer settings, dynamic scaling and/or shifting may be applied to ensure that the proper regions of each image are inspected.

In further embodiments, scaling factors for specific types of paper, speed, and/or dryer settings are empirically determined by measuring paper shrinkage during a standard paper setup procedure, and then stored in a database for reference by the print review system 130 during printing. Using these techniques, boundaries of the analysis region may be adjusted based on a combination of settings for a paper type, a dryer temperature, a print speed, and/or a print resolution as desired.

Figure 3:
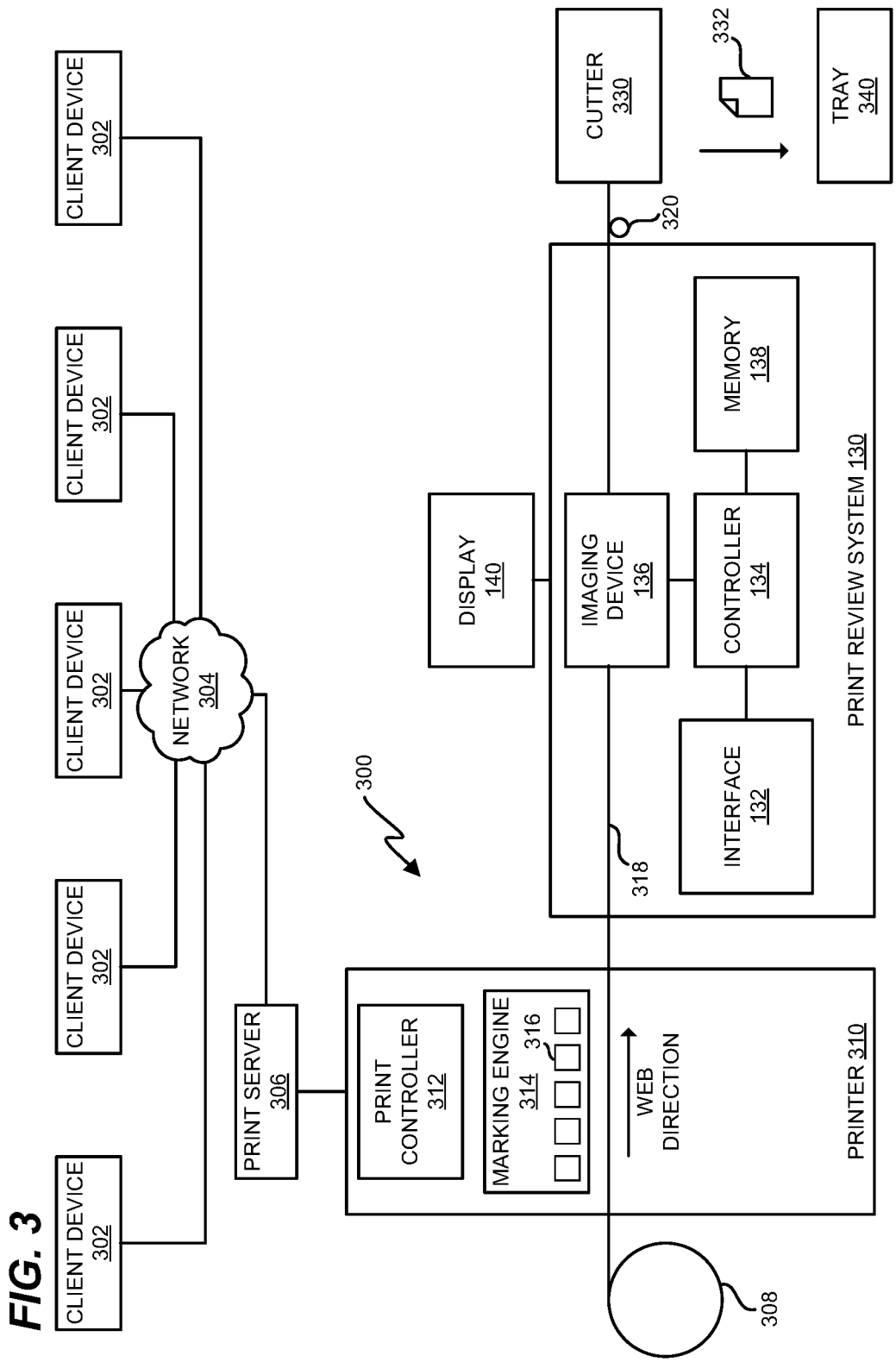
FIG. 3 is a block diagram of a print review system operating within a print shop in an illustrative embodiment.

FIG. 3 is a block diagram of a print review system 130 operating within a print shop 300 in an illustrative embodiment. According to FIG. 3, a print server 306 at the print shop 300 receives print jobs from one or more client devices 302 (e.g., via a network 304 such as the Internet). The print server 306 schedules the print jobs for printing at one or more printers 310. To initiate printing of an individual print job, print server 306 transmits the print job to a printer 310. A print controller 312 at the printer 310 processes (e.g., rasterizes) the print data for the job in accordance with a job ticket for the print job, and generates instructions for a marking engine 314 at the printer 310. The marking engine 314 receives a web 318 of print media from an unwinder 308, and marks the web 318 using printheads 316 which apply ink or another marking material (e.g., fluids, liquids, powders, etc. that are suitable for printing) to the web 318. Portions of the web 318 that have been marked advance downstream in a web direction to print review system 130. As these portions of the web 318 pass by imaging device 136, the imaging device 136 acquires images of the web 318. These images may be acquired each time a test pattern or page is recognized, periodically as new test patterns or pages pass the imaging device 136, or continuously in real-time. In this example, portions of the web 318 advance to a cutter 330, via roller 320. The cutter 330 cuts the portions into sheets 332 for stacking into a tray 340. In another embodiment, the portions of the web 318 exit the print review system 130 and advance towards a rewinder device that replaces cutter 330 (e.g., a roll-to-roll configuration), or are processed by any suitable form of post-print processing machinery and/or devices.

Images acquired via imaging device 136 are accessed by controller 134, which reviews the images in accordance with inspection parameters, in order to detect printhead conditions. In this embodiment, controller 134 is coupled for communication with print controller 312 of printer 310, network 304 and/or print server 306. Furthermore, the controller 134 may be configured to detect additional notifications based on communications with a print controller 312 of the printer, and include those additional notifications in a GUI. Examples of such notifications include a status of the printer 310 itself (e.g., pertaining to the existence of needed firmware upgrades, paper jam issues, etc.). In this embodiment, controller 134 also provides notifications that are not directly related to the print job that is currently printing. For example, controller 134 may report that imaging device 136 has stopped functioning, that the controller 134 was unable to locate a test pattern on the web 318 for review, etc. In one embodiment, controller 134 combines the various received notifications together for presentation at a GUI via display 140. Notifications of printhead conditions may then be reviewed by a print shop operator.

Figure 4:
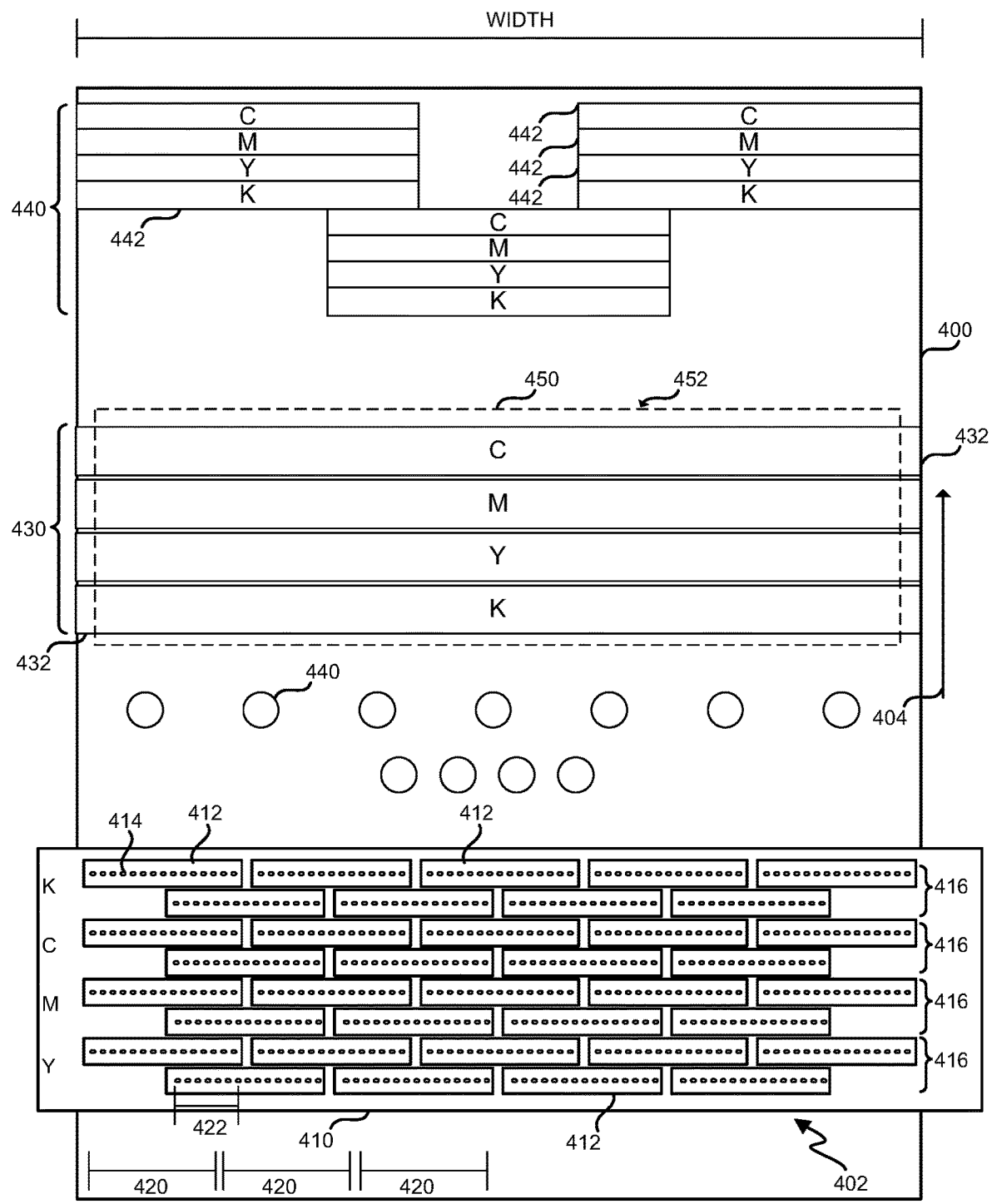
FIG. 4 depicts a page being marked by a marking engine in an illustrative embodiment.

FIG. 4 depicts a page 400 being marked by a marking engine 402 in an illustrative embodiment. The marking engine 402 applies test patterns 430 and 440 to the page 400 of print media as the page 400 advances in a process direction 404. In this embodiment, test patterns 430 and 440 include bands 432 and 442 for color planes of Cyan (C), Magenta (M), Yellow (Y), and Key Black (K). At the marking engine 402, one or more arrays 410 of printheads 412 for color planes 416 operate nozzles 414 to eject ink or another marking material onto page 400 of print media. Printheads 412 and/or nozzle 414 may be assigned to color planes/channels (e.g., cyan, magenta, yellow, key black, protector coating, clear, etc.) to eject corresponding marking materials (e.g., cyan, magenta, yellow, key black, protector coating, clear, etc.). In this embodiment, the printheads 412 occupy regions 420 along a width of the web 318 of print media. That is, each region 420 represents a portion of the width of the web 318 that is occupied by a specific printhead 412. In one embodiment, the regions 420 comprise locations 422, which each correspond with a grouping of ten to fifteen (or more) nozzles 414, however, this number may vary depending on the DPI of the printer and/or the scanner. The test patterns depicted in FIG. 4 may facilitate the detection of jetouts, misalignments, and/or other printhead conditions, and may be printed regularly at the start of each print job, after every page, after a predefined linear distance along a print job, etc. FIG. 4 also depicts an analysis region 450, which corresponds with a portion of an image of the page 400 that will be analyzed by print review system 130. The boundaries 452 of the analysis region 450 may be adjusted based on settings of a corresponding printer for the current print job.

Figure 5:
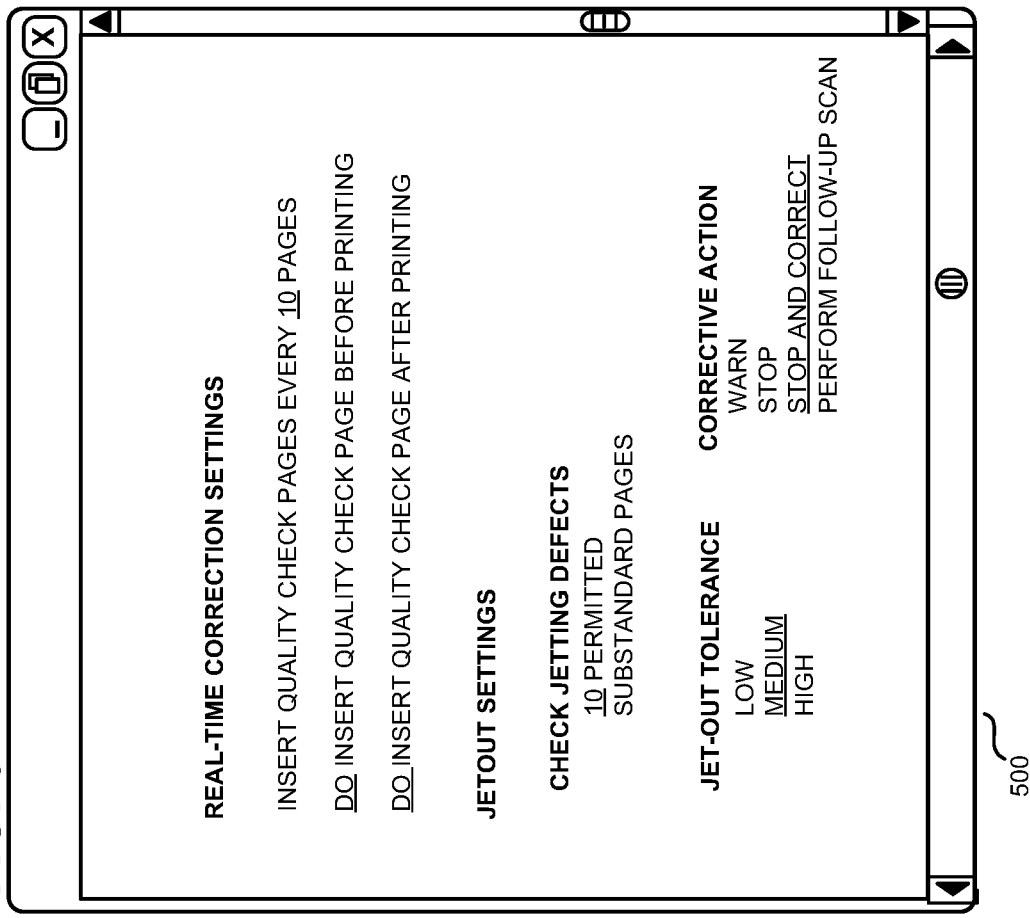
FIG. 5 depicts a Graphical User Interface (GUI) for modifying real-time correction and jetout settings in an illustrative embodiment.
Figure 6:
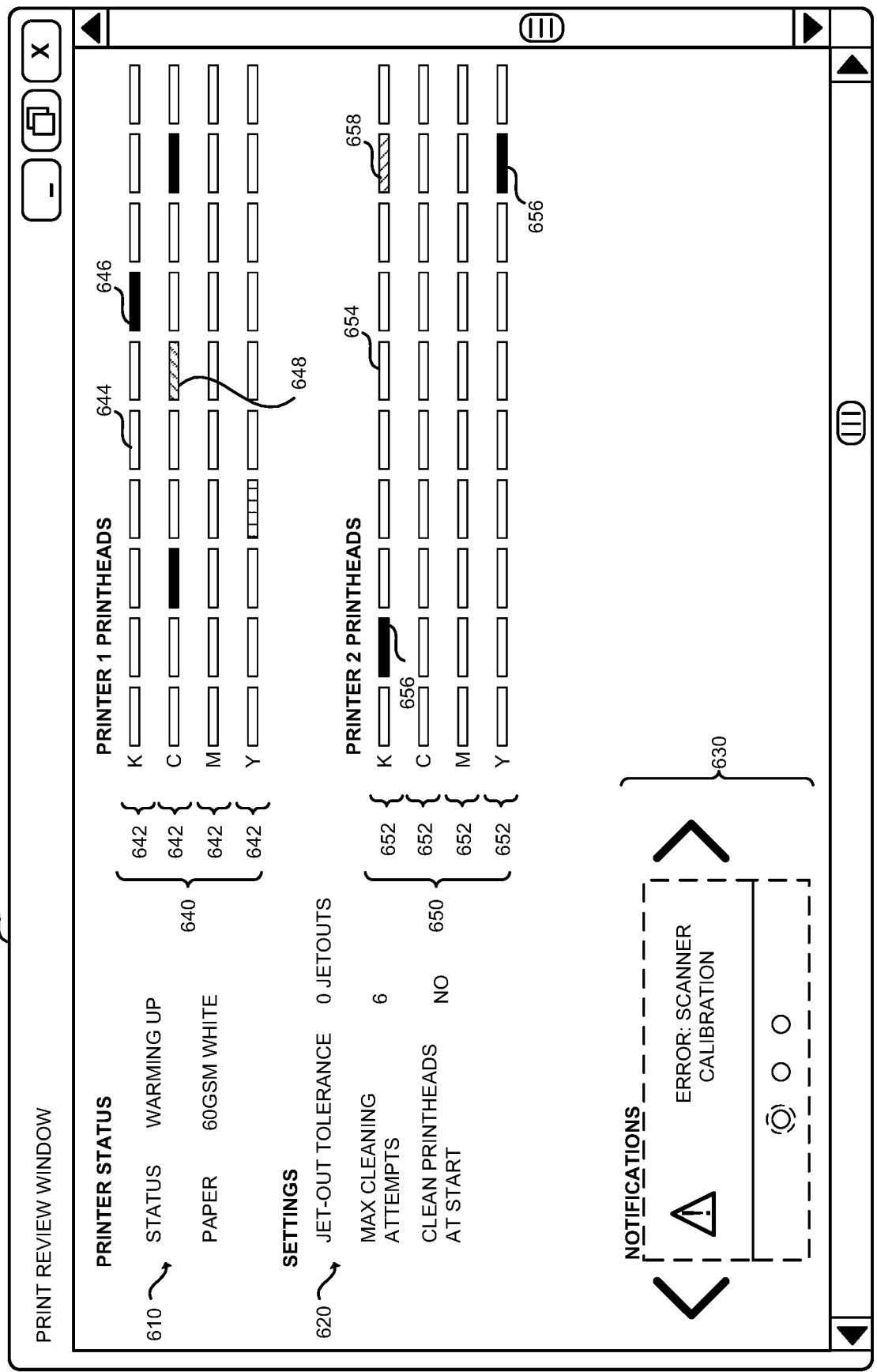
FIG. 6 depicts a GUI of a print review window in an illustrative embodiment.

FIGS. 5-6 depict various Graphical User Interfaces (GUIs) for initially configuring print review system 130. These GUIs may be stored as instructions in memory 138, and dynamically constructed by controller 134 based on the instructions for presentation at display 140. The initial configuration for a print review system 130 may define default values for various inspection parameters, or values of tables for consultation regarding inspection parameters. For example, configurations settings set to low, medium, or high may be associated with different default numerical values, which are deviated from based on the current settings of a printer during a print job.

FIG. 5 depicts a GUI 500 for modifying real-time correction and jetout settings in an illustrative embodiment. According to FIG. 5, the GUI 500 allows for a print shop operator to indicate the frequency of incoming "quality check pages" having test patterns for inspection (e.g., every X pages), whether or not quality check pages are inserted before or after printing, a number of permitted substandard pages, a jet-out tolerance, and corrective actions to perform in the event that a printhead condition is detected, etc. Specifically, the print shop operator may adjust a selection of underlined portions shown on the GUI 500, in order to indicate desired values. Examples of "substandard pages" are pages which are non-compliant. Examples of corrective actions include generating a warning at the GUI 500, instructing the printer 110 to halt printing of a print job, instructing the printer 110 to halt printing of a print job and initiate printhead cleaning, and performing follow-up scans.

In one embodiment, memory 138 stores multiple groups of instructions that each indicate inspection parameters for determining the compliance of different types and/or sizes of flush lines. Controller 134 selectively enables a group of instructions that correspond with the type and/or size of flush line being used by the printer 110 for the current print job, and disables the other groups. This process is performed by controller 134 based on an indication from the printer 110 of the current type and/or size of flush lines being used for the current print job.

FIG. 6 depicts a GUI 600 of a print review window in an illustrative embodiment. In this embodiment, the GUI 600 is formatted according to Hypertext Markup Language (HTML) in combination with Cascading Style Sheet (CSS) data in order to present a variety of elements reporting the status of a print job. The GUI 600 accesses data stored in memory 138 that indicates each printhead condition, as well as the region and/or location, and graphically presents this information, such as in an independent grid as shown herein, or overlaid on top of an image acquired by scanning print media. When overlaid on an image, each region is represented as a two-dimensional area on an image of a test pattern. For the purposes of this embodiment, the primary GUI elements comprise printer status regions 640 and 650. Each of these printer status regions 640 and 650 is subdivided into color planes 642 and 652. The printer status regions 640 and 650 indicate, on a printhead-by-printhead basis (or in some embodiments, a nozzle-by-nozzle basis), the printhead conditions experienced by each printhead of a printer. For example, printer status regions 640 and 650 may indicate the location of printheads that are experiencing jetout conditions. In this embodiment, fully operational printheads are indicated with symbols 644 and 654, while printheads experiencing a jetout at one or more nozzles are indicated with symbols 646 and 656, and printheads experiencing low ink conditions are indicated with symbols 648 and 658. This graphical presentation of printhead conditions allows a technician at the print shop to rapidly and intuitively locate printheads and/or nozzles that are experiencing issues at a printer 110.

GUI 600 also includes a carousel 630. Carousel 630 depicts notifications that are relevant to printer 110 and/or print review system 130. For example, notifications at carousel 630 may indicate the availability of firmware updates, the existence of calibration issues, etc.

The elements of the GUI further include a printer status section 610, which reports the current status of a printer 110 as indicated by a print controller of the printer 110, or a print server. A settings section 620 indicates settings for the print review system 130. The settings section 620 includes an indication of a number of tolerated jet-outs allowed at printheads of the printer 110 before an error is indicated or printing is halted. The settings section 620 also indicates a maximum number of cleaning attempts to perform on a printhead before reporting a jetout issue, and whether or not printheads are cleaned prior to the start of a print job.

In this embodiment, the number of cleanings that are attempted before a printhead is reported as not cleaned is selectable by the user for when the printer prepares to print, while the number of attempts to clean before identifying a printhead as failed is separate. In one embodiment, five consecutive cleaning attempts are allowed to recover a specific nozzle. In a further embodiment, detected printhead failures are used to define bypassed regions. Thus, with respect to dynamic adjustment of inspection parameters based on settings for the printer 110, the GUI 600 allows for configuration of a corrective action in the form of printhead cleaning if a threshold for non-compliant pages has been exceeded during analysis of a print job. For example, the settings section 620 may be used to set a printhead cleaning process with a desired jet-out tolerance, and maximum number of cleaning attempts.

Figure 7:
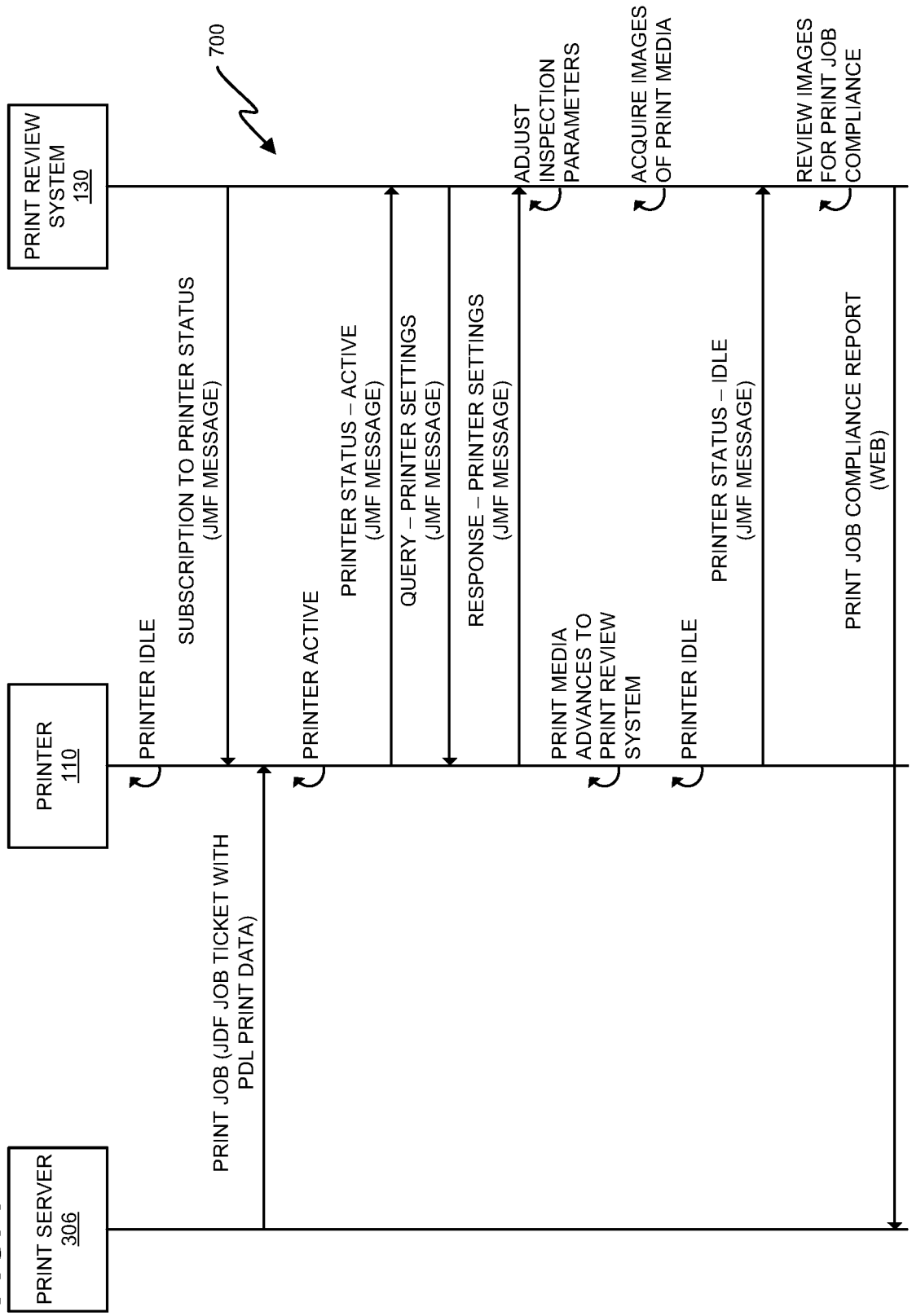
FIG. 7 is a message diagram depicting communications between a printer, print server, and print review system in an illustrative embodiment.

With a discussion of GUIs for defining an initial configuration of a print review system 130 provided above, FIG. 7 provides context in the form of a message diagram 700 illustrating communications that take place between the printer 110 and a print review system 130 each time the printer 110 initiates processing of a print job in an illustrative embodiment. According to FIG. 7, printer 110 starts the day in an idle state. Print review system 130 transmits a JMF message to the printer 110 subscribing to changes in printer status. At some point in time, print server 306 transmits a next print job to the printer 110.

The printer 110 transitions to an active status, and reconfigures its settings based on instructions in print data for the print job. For example, the printer 110 may adjust the number of color planes used for the print job, may adjust a printing resolution, ink type, paper type (e.g., a dot gain associated with paper type), or other settings. The printer 110 transmits a notification to the print review system 130 indicating the change in status to active, and the print review system transmits a JMF query to the printer 110 for the current settings used by the printer 110 to print the job. The printer 110 supplies a JMF response with the printer settings.

Based on the printer settings, the print review system 130 adjusts inspection parameters, and proceeds to acquire images of print media marked by the printer 110 after the print media 120 advances to the print review system 130. The printer 110 completes printing, and transmits a change in status (e.g., to idle) to the print review system 130. The print review system 130 completes inspection of the print job, reports compliance to the print server 306, and/or updates a display with this compliance information. The steps shown in the message diagram of FIG. 7 may be performed in real-time each time a new print job is processed by the printer 110. This enables the print review system 130 to dynamically adjust to the contents of each incoming print job, without needing to be separately configured by a print shop operator.

FIGS. 8-15 are tables depicting variations in thresholds and other inspection parameters based on printer settings in illustrative embodiments, and such tables may be stored in memory 138 of a print review system 130. These tables use shorthand to refer to resolution in Dots Per Inch (DPI), as well as a printing speed in meters per minute. Thus, for example, "1200×1200–75" refers to printing at 1200 DPI along both the width and length of the page, at a rate of seventy five meters per minute. Meanwhile, quality parameters in the tables refer to categories of desired quality set by a user, such as "high setting," "medium setting," or "low setting," which each may correspond with different inspection parameters. The quality parameters may be defined by the various GUIs discussed above (e.g., via the jet-out tolerance menu for GUI 500 of FIG. 5, discussed above) or by other GUIs, such as those for defining alignment or uniformity tolerances.

In FIG. 8, tables 800 illustrate predefined thresholds for allowable variation in jet out optical density within flush lines. The tables 800 adjust this inspection parameter based on a combination of dot gain (which is defined by paper type used by the print job), ink type, printing resolution, and printing speed. This enables a print review system 130 to dynamically alter jet out optical density threshold settings based on printer settings for the current job being printed. In one embodiment, the tables 800 are empirically pre-determined. As used herein, the jet out optical density threshold parameter is an allowable tolerance/threshold of the difference between the measured value of an optical density for a given nozzle and a target (e.g., the average printed optical density). The average may be determined across a single printhead or an entire flush line as desired.

In FIG. 9, tables 900 define a jetout persistence parameter (i.e., number of consecutive pages having jetouts) based on a combination of type of flushing used and the number of printed dots in each flushing line. Thus, by interrogating a printer to determine resolution and flushing type, a print review system 130 may dynamically adjust its parameters for allowed pages with jetouts. In one embodiment, the relationship between jetout persistence parameter and flush line type is that the persistence parameter is larger for low ink deposition flush lines than for high ink deposition flush lines. In a further embodiment, jet out parameters are also determined based on number of lines in a flush line: the relationship for line flushing is that the jetout persistence parameter is inversely proportional to the number of flush lines on a page. That is, the jetout persistence parameter increases as the number of flush lines per page decreases.

In a further embodiment, jet out optical density threshold is determined based on the type of flush line setting. For example, the jet out optical density threshold may be reduced if high ink deposition flushing is used instead of low ink deposition flushing. In high ink deposition flushing, all the nozzles for in a line a color plane deposit ink in a single line with no space between color. In low ink deposition flushing, only half the nozzles of a color plane fire in each line, and small gaps are placed between colors. This makes it easier to detect jetouts in low ink deposition flushing.

In FIG. 10, tables 1000 define a number of allowed jetouts detected per printhead at a flush line based on a combination of resolution and whether or not the printer is performing low ink deposition flushing (e.g., coated line flushing) or high ink deposition flushing (e.g., plain line flushing) in an illustrative embodiment. By dynamically adjusting this inspection parameter, a print review system 130 may account for the fact that lower resolutions of printing may result in a larger number of jetouts being acceptable. As used herein, "allowed jetouts detected per printhead at a flush line" refers to the number of jetouts per printhead that trigger an alert. The number of jet outs permitted per head is larger for high ink deposition flushing versus low ink deposition flushing. This particular inspection parameter may be most relevant in regards to print jobs that include inserted flushing pages for inspection. High ink deposition flushing is often used for print media that exhibits a much higher dot gain, and/or for print media having a lower print quality. Print media that are considered high quality often do not utilize high ink deposition flushing, for example owing to drying issues and/or ink bleeding. In such circumstances, the paper itself cannot absorb the ink, causing some to remain on the surface.

In FIG. 11, tables 1100 define an allowed jetout optical density threshold for a flushing page based on a combination of ink type, resolution, and dot gain in an illustrative embodiment. Furthermore, acceptable optical density may be defined per printhead, for example as a function of ink type, dot gain, and/or resolution. This enables the print review system 130 to dynamically account for expected variations in contrast caused by different types of printing.

In FIG. 12, tables 1200 define a number of allowed jetouts detected per printhead at a flushing page based on resolution in an illustrative embodiment. By dynamically adjusting this parameter for inspection, a print review system 130 may account for the fact that lower resolutions of printing may result in a larger number of jetouts being acceptable. The user may then select a desired quality (e.g., Jet Out Tolerance as shown in FIG. 5) of "high," "medium," or "low," which is considered in combination with the settings of the printer 110.

In FIG. 13, tables 1300 define an allowable color alignment distance based on a combination of paper type (e.g., dot gain pertaining thereto) and resolution in an illustrative embodiment. By dynamically adjusting inspection parameters based on these printer settings, the print review system 130 is capable of accurately and automatically reporting color alignment compliance for a variety of types of print job.

In FIG. 14, tables 1400 define an allowable alignment deviation for head alignment based on a combination of paper type (e.g., dot gain dot gain pertaining thereto) and print resolution in an illustrative embodiment. Phrased another way, the table of FIG. 14 provides values for an inspection parameter defining acceptable alignment deviation between different printheads of the printer, based on settings for print resolution and dot gain. In further embodiments, print speed may also be considered when defining the alignment deviation. By dynamically adjusting inspection parameters based on these printer settings, the print review system 130 is capable of accurately and automatically reporting head alignment compliance for a variety of types of print job.

Figure 15:

In FIG. 15, tables 1500 define an allowable density variation across a width of the page based on a combination of paper type (e.g., dot gain dot gain pertaining thereto) and resolution in an illustrative embodiment. In further embodiments, print speed may also be considered when defining the alignment deviation. This dynamic process ensures that expected density variations are not mis-reported as non-compliant.

Examples

In the following examples, additional processes, systems, and methods are described. The following clauses and/or examples pertain to further embodiments or examples. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to perform acts of the method, or of an apparatus or system according to embodiments and examples described herein.

A first clause is provided in the form of a print review system comprising a memory configured to store inspection parameters of print media marked by a printer, an interface configured to communicate with the printer, and a controller that is configured, in response to the printer initiating processing of a print job, to receive an indication via the interface of settings used by the printer in processing the print job, to modify the parameters based on the settings, to inspect the print media based on the modified parameters, and to report compliance of the print job with the modified parameters.

A further clause is provided as the system of the first clause wherein: the controller is configured to modify the inspection parameters before portions of the print media marked by the printer reach an imaging device of the print review system.

A further clause is provided as the system of the first clause wherein: each time the printer initiates printing of a print job, the controller is configured to query the printer for the settings and modify the inspection parameters based on the settings.

A further clause is provided as the system of the first clause wherein: the controller is configured to modify the inspection parameters by adjusting a parameter defining acceptable alignment deviation between different printheads of the printer based on settings for at least one of: print resolution, print speed, and dot gain.

A further clause is provided as the system of the first clause wherein: the controller is configured to modify the inspection parameters by adjusting a parameter defining acceptable optical density per printhead of the printer based on a setting for at least one of: print resolution, print speed, and dot gain.

A further clause is provided as the system of the first clause wherein: the controller is configured to modify the inspection parameters by adjusting a parameter defining acceptable optical density per printhead of the printer based on a setting for ink type.

A further clause is provided as the system of the first clause wherein: the controller is configured to adjust boundaries of an analysis region within an image generated by an imaging device of the print review system, based on a combination of settings selected from the group consisting of: a paper type, a dryer temperature, a print speed, and a print resolution.

A further clause is provided as the system of the first clause further comprising: the printer.

A second clause is provided in the form of a method comprising: storing, at a print review system, inspection parameters of print media marked by a printer; exchanging communications with a printer via an interface of the print review system; determining that the printer has initiated processing of a print job based on the communications; receiving an indication of settings currently used by the printer for the print job; modifying the inspection parameters based on the settings; inspecting the print media based on the modified parameters; and reporting compliance of the print job with the modified parameters.

A further clause is provided as the method of the second clause, further comprising: modifying the inspection parameters before portions of the print media marked by the printer reach an imaging device of the print review system.

A further clause is provided as the method of the second clause, wherein: querying the printer for the settings and modifying the inspection parameters based on the settings are performed each time the printer initiates printing of a print job.

A further clause is provided as the method of the second clause, wherein: modifying the inspection parameters comprises adjusting a parameter for acceptable alignment deviation between different printheads of the printer based on a combination of settings for at least one of: print resolution, print speed, and dot gain.

A further clause is provided as the method of the second clause, wherein: modifying the inspection parameters comprises adjusting a parameter for acceptable optical density per printhead of the printer based on a setting for at least one of: print resolution, print speed, and dot gain.

A further clause is provided as the method of the second clause, wherein: modifying the inspection parameters comprises adjusting a parameter for acceptable optical density per printhead of the printer based on a setting for ink type.

A third clause is provided in the form of a non-transitory computer readable medium embodying programmed instructions which, when executed by a processor, are operable for performing a method comprising: storing, at a print review system, inspection parameters of print media marked by a printer; exchanging communications with a printer via an interface of the print review system; determining that the printer has initiated processing of a print job based on the communications; receiving an indication of settings currently used by the printer for the print job; modifying the inspection parameters based on the settings; inspecting the print media based on the modified parameters; and reporting compliance of the print job with the modified parameters.

A further clause is provided as the non-transitory computer readable medium of the third clause, wherein the instructions further comprise instructions for: modifying the inspection parameters before portions of the print media marked by the printer reach an imaging device of the print review system.

A further clause is provided as the non-transitory computer readable medium of the third clause, wherein: querying the printer for the settings and modifying the inspection parameters based on the settings are performed each time the printer initiates printing of a print job.

A further clause is provided as the non-transitory computer readable medium of the third clause, wherein: modifying the inspection parameters comprises adjusting a parameter for acceptable alignment deviation between different printheads of the printer based on a combination of settings for at least one of: print resolution, print speed, and dot gain.

A further clause is provided as the non-transitory computer readable medium of the third clause, wherein: modifying the inspection parameters comprises adjusting a parameter for acceptable optical density per printhead of the printer based on a setting at least one of: print resolution, print speed, and dot gain.

A further clause is provided as the non-transitory computer readable medium of the third clause, wherein: modifying the inspection parameters comprises adjusting a parameter for acceptable optical density per printhead of the printer based on a setting for ink type.

Figure 16:
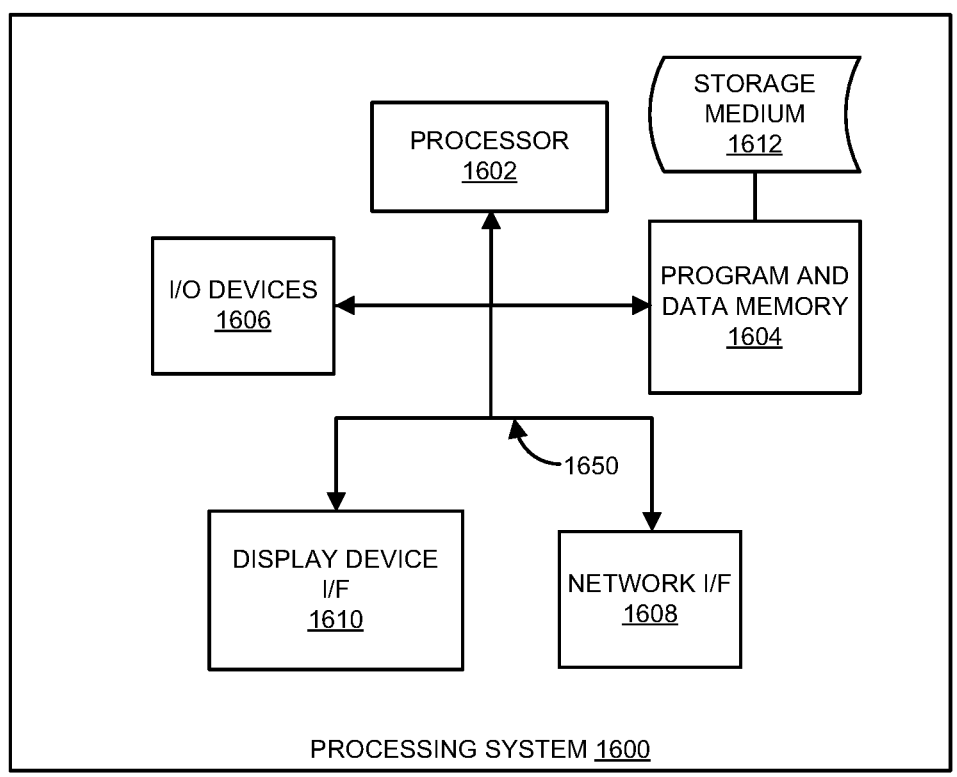
FIG. 16 illustrates a processing system operable to execute a computer readable medium embodying programmed instructions to perform desired functions in an illustrative embodiment.

Embodiments disclosed herein can take the form of software, hardware, firmware, or various combinations thereof. In one particular embodiment, software is used to direct a processing system of print review system 130 to perform the various operations disclosed herein. FIG. 16 illustrates a processing system 1600 operable to execute a computer readable medium embodying programmed instructions to perform desired functions in an illustrative embodiment. Processing system 1600 is operable to perform the above operations by executing programmed instructions tangibly embodied on computer readable storage medium 1612. In this regard, embodiments of the invention can take the form of a computer program accessible via computer-readable medium 1612 providing program code for use by a computer or any other instruction execution system. For the purposes of this description, computer readable storage medium 1612 can be anything that can contain or store the program for use by the computer.

Computer readable storage medium 1612 can be an electronic, magnetic, optical, electromagnetic, infrared, or semiconductor device. Examples of computer readable storage medium 1612 include a solid state memory, a magnetic tape, a removable computer diskette, a random access memory (RAM), a read-only memory (ROM), a rigid magnetic disk, and an optical disk. Current examples of optical disks include compact disk—read only memory (CD-ROM), compact disk—read/write (CD-R/W), and DVD.

Processing system 1600, being suitable for storing and/or executing the program code, includes at least one processor 1602 coupled to program and data memory 1604 through a system bus 1650. Program and data memory 1604 can include local memory employed during actual execution of the program code, bulk storage, and cache memories that provide temporary storage of at least some program code and/or data in order to reduce the number of times the code and/or data are retrieved from bulk storage during execution.

Input/output or I/O devices 1606 (including but not limited to keyboards, displays, pointing devices, etc.) can be coupled either directly or through intervening I/O controllers. Network adapter interfaces 1608 may also be integrated with the system to enable processing system 1600 to become coupled to other data processing systems or storage devices through intervening private or public networks. Modems, cable modems, IBM Channel attachments, SCSI, Fibre Channel, and Ethernet cards are just a few of the currently available types of network or host interface adapters. Display device interface 1610 may be integrated with the system to interface to one or more display devices, such as printing systems and screens for presentation of data generated by processor 1602.

Although specific embodiments were described herein, the scope of the invention is not limited to those specific embodiments. The scope of the invention is defined by the following claims and any equivalents thereof.

What is claimed is:

1. A print review system comprising:
a memory configured to store inspection parameters of print media marked by a printer, wherein the inspection parameters each comprise an adjustable variable at the print review system for performing inspection of the print media;
an interface configured to communicate with the printer; and
a controller that is configured, in response to the printer initiating processing of a print job, to receive an indication via the interface of settings used by the printer in processing the print job, to modify the inspection parameters based on the settings, to inspect the print media based on the modified inspection parameters, and to report compliance of the print job with the modified inspection parameters.

2. The system of claim 1 wherein:
the controller is configured to modify the inspection parameters before portions of the print media marked by the printer reach an imaging device of the print review system.

3. The system of claim 1 wherein:
each time the printer initiates printing of a print job, the controller is configured to query the printer for the settings and modify the inspection parameters based on the settings.

4. The system of claim 1 wherein:
the controller is configured to modify the inspection parameters by adjusting an inspection parameter defining acceptable alignment deviation between different printheads of the printer based on settings for at least one of: print resolution, print speed, and dot gain.

5. The system of claim 1 wherein:
the controller is configured to modify the inspection parameters by adjusting an inspection parameter defining acceptable optical density per printhead of the printer based on a setting for at least one of: printer resolution, print speed, and dot gain.

6. The system of claim 1 wherein:
the controller is configured to modify the inspection parameters by adjusting an inspection parameter defining acceptable optical density per printhead of the printer based on a setting for ink type.

7. The system of claim 1 wherein:
the controller is configured to adjust boundaries of an analysis region within an image generated by an imaging device of the print review system, based on a combination of settings selected from the group consisting of: a paper type, a dryer temperature, a print speed, and a print resolution.

8. The system of claim 1, further comprising:
the printer.

9. A method comprising:
storing, at a print review system, inspection parameters of print media marked by a printer wherein the inspection parameters each comprise an adjustable variable at the print review system for performing inspection of the print media;
exchanging communications with a printer via an interface of the print review system;
determining that the printer has initiated processing of a print job based on the communications;
receiving an indication of settings currently used by the printer for the print job;
modifying the inspection parameters based on the settings;
inspecting the print media based on the modified inspection parameters; and
reporting compliance of the print job with the modified inspection parameters.

10. The method of claim 9 further comprising:
modifying the inspection parameters before portions of the print media marked by the printer reach an imaging device of the print review system.

11. The method of claim 9 wherein:
querying the printer for the settings and modifying the inspection parameters based on the settings are performed each time the printer initiates printing of a print job.

12. The method of claim 9 wherein:
modifying the inspection parameters comprises adjusting an inspection parameter for acceptable alignment deviation between different printheads of the printer based on a combination of settings for at least one of: print resolution, print speed, and dot gain.

13. The method of claim 9 wherein:
modifying the inspection parameters comprises adjusting an inspection parameter for acceptable optical density per printhead of the printer based on a setting for at least one of: print resolution, print speed, and dot gain.

14. The method of claim 9 wherein:
modifying the inspection parameters comprises adjusting an inspection parameter for acceptable optical density per printhead of the printer based on a setting for ink type.

15. A non-transitory computer readable medium embodying programmed instructions which, when executed by a processor, are operable for performing a method comprising:
storing, at a print review system, inspection parameters of print media marked by a printer wherein the inspection parameters each comprise an adjustable variable at the print review system for performing inspection of the print media;
exchanging communications with a printer via an interface of the print review system;
determining that the printer has initiated processing of a print job based on the communications;
receiving an indication of settings currently used by the printer for the print job;
modifying the inspection parameters based on the settings;
inspecting the print media based on the modified inspection parameters; and
reporting compliance of the print job with the modified inspection parameters.

16. The non-transitory computer readable medium of claim 15 wherein the instructions further comprise instructions for:
modifying the inspection parameters before portions of the print media marked by the printer reach an imaging device of the print review system.

17. The non-transitory computer readable medium of claim 15 wherein:
   querying the printer for the settings and modifying the inspection parameters based on the settings are performed each time the printer initiates printing of a print job.

18. The non-transitory computer readable medium of claim 15 wherein:
   modifying the inspection parameters comprises adjusting an inspection parameter for acceptable alignment deviation between different printheads of the printer based on a combination of settings for at least one of: print resolution, print speed, and dot gain.

19. The non-transitory computer readable medium of claim 15 wherein:
   modifying the inspection parameters comprises adjusting an inspection parameter for acceptable optical density per printhead of the printer based on a setting for at least one of: print resolution, print speed, and dot gain.

20. The non-transitory computer readable medium of claim 15 wherein:
   modifying the inspection parameters comprises adjusting an inspection parameter for acceptable optical density per printhead of the printer based on a setting for ink type.

\* \* \* \* \*